United States Patent [19]

Falaki et al.

[11] Patent Number: 6,038,129
[45] Date of Patent: Mar. 14, 2000

[54] COOLING ELECTRONIC APPARATUS

[75] Inventors: Hamid Reza Falaki, Peatmoor; William George Gates, Wolverton, both of United Kingdom; Patrick Francis Hanlon, Rundle Blessington, Ireland; Martin Michael Mark Keegan, Greystones, Ireland; Daniel Peter Kelly, Donnybrook, Ireland

[73] Assignee: Lucent Technologies Inc., Murray Hill, N.J.

[21] Appl. No.: 09/300,341

[22] Filed: Apr. 27, 1999

[30] Foreign Application Priority Data

Apr. 28, 1998 [EP]  European Pat. Off. ............. 98303321

[51] Int. Cl.$^7$ ...................................... H05K 7/20
[52] U.S. Cl. .......................... 361/699; 361/688; 361/689; 361/690; 361/698; 361/700; 361/720; 174/15.2; 174/16.1; 165/80.3; 165/80.4
[58] Field of Search ................... 361/688–690, 361/694, 695, 698, 699, 700, 703, 704, 715, 720; 174/15.1, 15.2, 16.1, 16.3; 165/80.2, 80.3, 80.4

[56] References Cited

U.S. PATENT DOCUMENTS

| | | | |
|---|---|---|---|
| 4,535,386 | 8/1985 | Frey, Jr. et al. | 361/714 |
| 5,065,278 | 11/1991 | Schultz | 361/688 |
| 5,812,373 | 9/1998 | Hwang | 361/704 |
| 5,831,830 | 11/1998 | Mahler | 361/704 |
| 5,915,466 | 6/1999 | Aakalu et al. | 165/121 |

FOREIGN PATENT DOCUMENTS

| | | | |
|---|---|---|---|
| 95302723 | 4/1995 | European Pat. Off. | H05K 7/20 |

OTHER PUBLICATIONS

Formcast: "Aluminium and Zinc Casting, Investment Casting, Sand Casting" Formation Ltd. 1998 p. 1.

"East Coast Casting Co. Ltd." "Norfolk Foundry Watton Casting" p. 1.

Hufnagel, W. "Aluminium–Schlussel" "Aluminium Verlag Editon 2 1983" p. 109.

Hufnagel, W. "Aluminium–Taschenbuch" "Aluminium Verlag Editon 14 1983" pp. 98–110.

*Primary Examiner*—Leo P. Picard
*Assistant Examiner*—Boris L. Chervinsky

[57] ABSTRACT

An electronic apparatus having a heat dissipative external enclosure is disclosed. The external enclosure having a containment wall from which depend extended surfaces or fins having a length extending vertically and defining channels therebetween. The thickness of the enclosure between external surfaces of opposed containment walls varying between a relatively thin portion and a relatively thick portion to provide an interior space having a relatively narrow portion and a relatively wide portion to accommodate components or units of corresponding different extent. The fins having outer edges, spaced from the containment wall, and having plain first opposed surfaces adjacent their outer edges, the first surfaces including a first angle therebetween. The fins or parts of fins adjacent the relatively thin portion of the enclosure also having plain second opposed surfaces inwards of the first surfaces, the second surfaces including therebetween a second angle greater than the first angle. Making the thickness of the enclosure between external surfaces of opposed containment walls vary between a relatively thin portion and a relatively thick portion so that the interior space fits components or units of corresponding different extent, allows the fins to have a greater depth than would be the case if the thickness were constant. Making the deeper fins with roots having a greater draft angle, e.g. 3° allows the deeper fins or parts of fins to come out of the mould more readily than using a constant draft angle, e.g. 2°, especially when the casting material is LM20.

12 Claims, 7 Drawing Sheets ic apparatus, the external enclosure having a contain-

COOLING ELECTRONIC APPARATUS

CROSS-REFERENCE TO RELATED APPLICATION

This application claims priority of European Patent Application No. 98303321.8, which was filed on Apr. 28, 1998.

FIELD OF THE INVENTION

This invention relates to cooling electronic apparatus.

BACKGROUND OF THE INVENTION

The background to the invention will be described with reference to a particular application. Other applications may occur readily to the reader.

Cellular mobile telecommunications networks utilize electronic apparatus that is mounted outside at base stations. The apparatus includes high power units, for example a radio transmitter that includes a high power wide band amplifier. Being mounted outside the apparatus is subject to whatever weather prevails. Generally, the apparatus is contained by an environmentally sealed outer enclosure that is itself mounted within a ventilated case. It is desired that cooling is normally by natural convection so as to avoid the noise, power consumption and maintenance associated with fans necessary to provide forced convection.

SUMMARY OF THE INVENTION

In accordance with one aspect of the invention, there is provided electronic apparatus having a heat dissipative external enclosure, the external enclosure having a containment wall from which depend extended surfaces or fins having a length extending vertically and defining channels therebetween. The thickness of the enclosure between external surfaces of opposed containment walls varying between a relatively thin portion and a relatively thick portion to provide an interior space having a relatively narrow portion and a relatively wide portion to accommodate components or units of corresponding different extent. The fins having outer edges, spaced from the containment wall, and having plain first opposed surfaces adjacent their outer edges, the first surfaces including a first angle therebetween. The fins or parts of fins adjacent the relatively thin portion of the enclosure also having plain second opposed surfaces inwards of the first surfaces, the second surfaces including therebetween a second angle greater than the first angle. In a case where the relatively thick portion of the enclosure and the relatively thin portion of the enclosure are located one above another, the first opposed surfaces preferably extend the full length of the fins which extend over both portions. The fins are preferably evenly spaced and the outer edges preferably lie in a common plane.

The external enclosure is preferably contained by a case that has sidewalls that, with the containment walls define air passages into which the extended surfaces or fins extend. Further improvements can be made if the case has vents at the top and the bottom of the air passages, and has louvers in one or more its side walls, louvers lower in the side wall(s) slanting upwards and inwards, louvers higher in the side walls slanting upwards and outwards.

Yet further improvements may be obtained if components or units dissipating higher power are either located below components or units dissipating lower power or connected to the containment wall by a heat pipe having its condenser lower than the component or unit. An example of a unit which is preferably located low in the external enclosure is a power supply.

A further improvement may be obtained if the extended surfaces or fins are spaced sufficiently that at no location is a boundary layer established completely across a channel by air flowing therein by convection.

Making the thickness of the enclosure between external surfaces of opposed containment walls vary between a relatively thin portion and a relatively thick portion so that the interior space fits components or units of corresponding different extent, allows the fins to have a greater depth than would be the case if the thickness were constant. Making the deeper fins with roots having a greater draft angle, e.g. 3° the fins allows the deeper fins or parts of fins to come out of the mould more readily than using a constant draft angle, e.g. 2°, especially when the casting material is LM20.

BRIEF DESCRIPTION OF THE DRAWINGS

One embodiment of the invention will now be described by way of example with reference to the accompanying drawings, in which.

DETAILED DESCRIPTION

Figure 1:
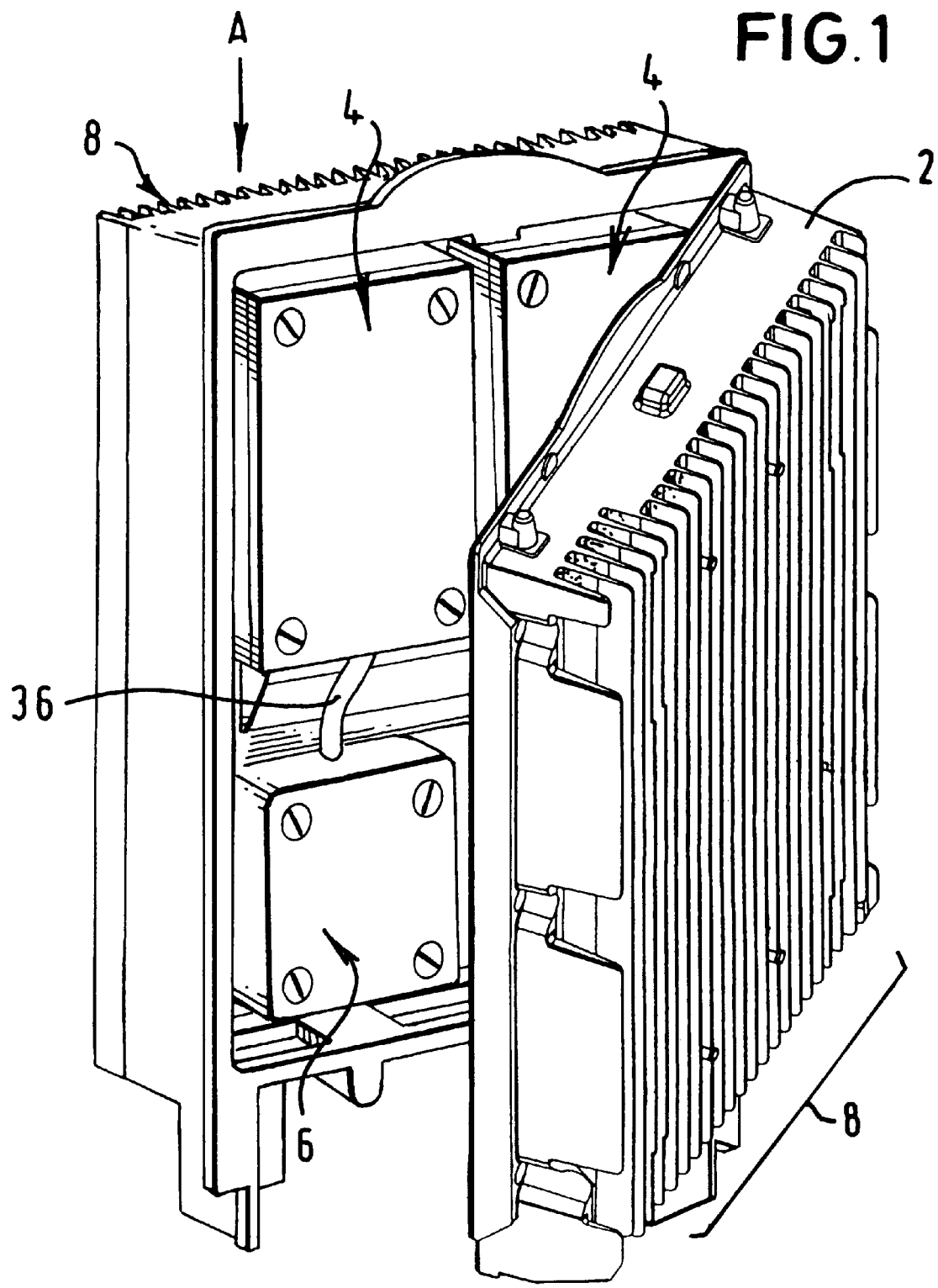
FIG. 1 illustrates an external enclosure of electronic apparatus embodying the invention.
Figure 2:
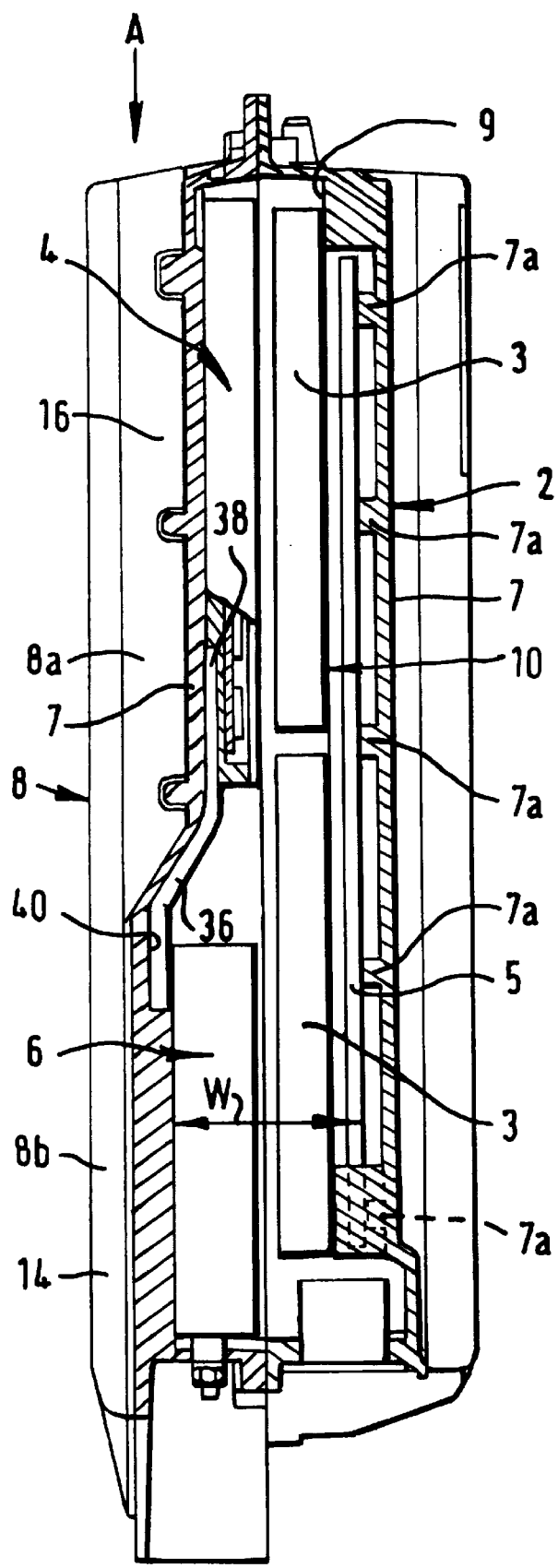
FIG. 2 is a side view in cross section of the enclosure of FIG. 1.
Figure 3:
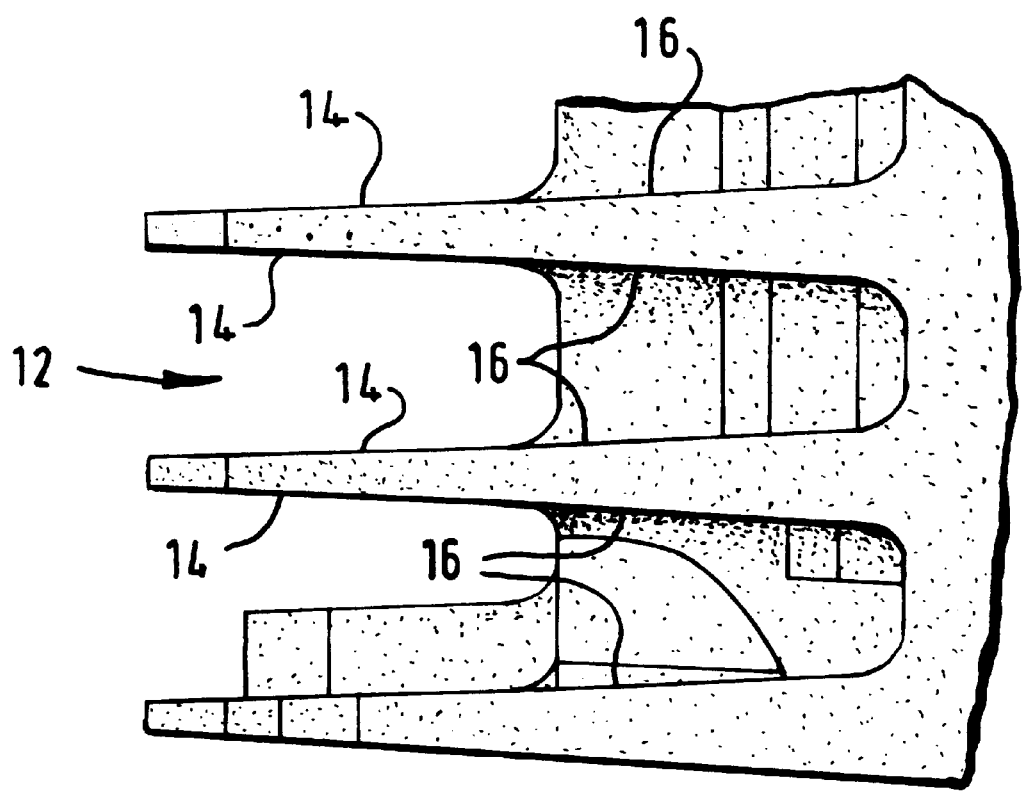
FIG. 3 is a scrap end view in the direction of arrow A of FIG. 2.
Figure 7:
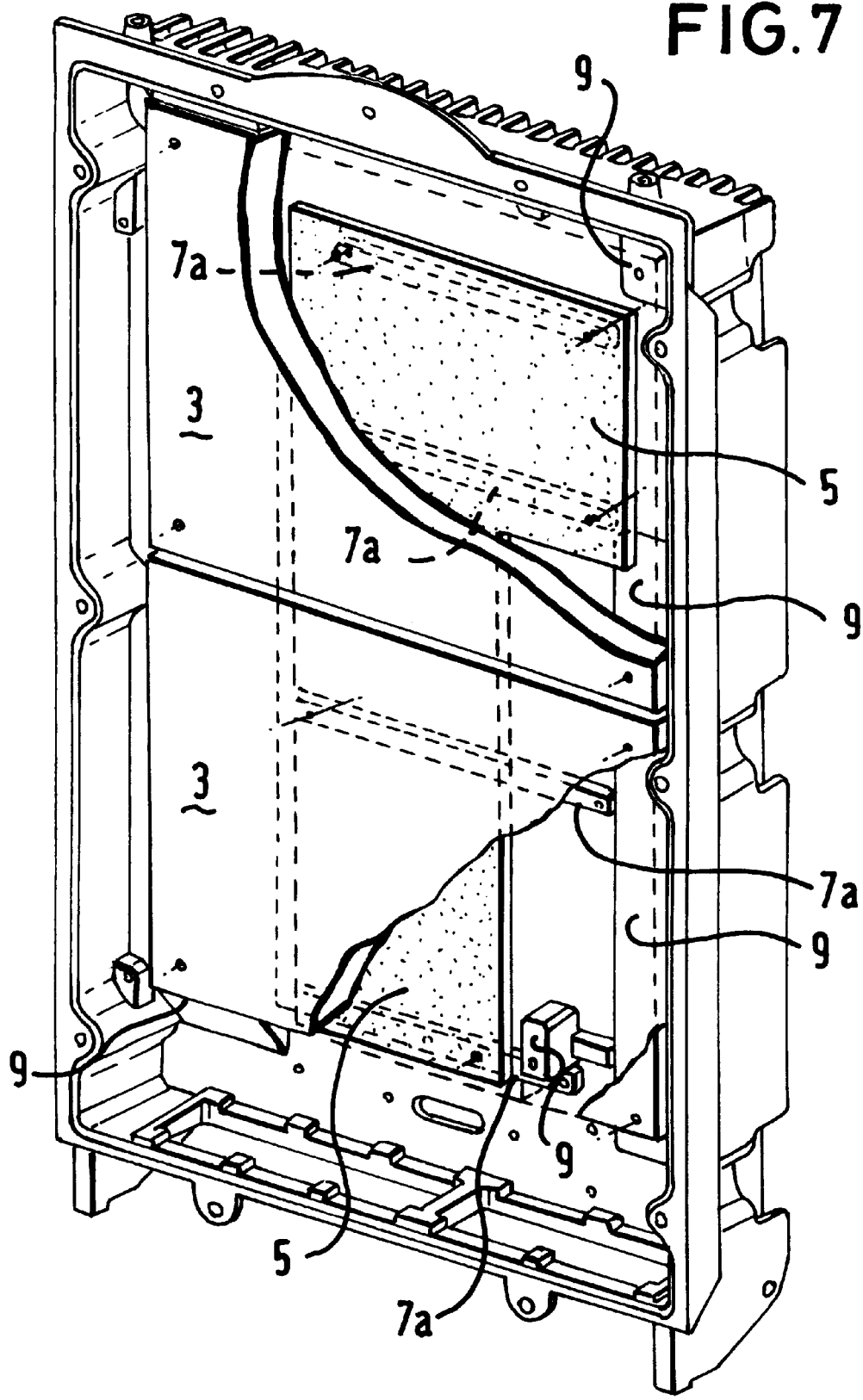
FIG. 7 illustrates the inside of one part of the enclosure of FIG. 1.

Referring to FIGS. 1 and 2 concurrently, a base station for a cellular mobile telecommunications network comprises electronic equipment contained by external enclosure 2. Electronic units such as RF screened transmitter receivers 3, RF screened power amplifiers 4, processor board 5 (mounting components not shown) and duplexers 6 are environmentally sealed within the enclosure 2, which is shown open in FIG. 1. Referring to FIGS. 2 and 7 concurrently, processor board 5 is mounted on protuberances 7a from wall 7 of the external enclosure. Transmitter/receivers 3 are mounted over processor board 5 on protuberances 9 from wall 7. The power amplifier and other units dissipate a significant amount of power and require cooling. Because the enclosure is sealed, cooling is effected by conduction. For example there is conduction from power amplifiers 4 to the wall 7 of the enclosure on which the power amplifiers are mounted. The enclosure is cooled by convection. Referring again to FIGS. 1 and 2 concurrently, to improve the cooling of the enclosure, it is provided with extended surfaces or fins 8. In order to maximize the size of the fins within a given overall dimension, interior space 10 of the enclosure has a width w that varies sufficiently to accommodate the electronic units 4, 6 etc. without a significant waste of space. This allows the extended surfaces or fins 8 to vary in depth between a deep part 8a where the interior space required to accommodate the power amplifier 4 is narrow, to a shallower part 8b where the interior space required to accommodate the duplexer 6 is wider. The outer ends of the fins are contained in a common plain. Thus the maximum depth of the fins is obtained within the overall dimensions. Referring to FIG. 3, the fins are evenly spaced at a sufficient distance within the length of channels 12 to ensure that a boundary layer does not establish itself across the channels between the fins.

Conventionally, the enclosure 2 would be cast in light metal LM6. Enclosures for electronic apparatus are conventionally cast in light metal specification LM6, which is easy to cast. Light metal specification LM20 is more difficult to cast and is more expensive. Light metal LM6 has a thermal conductivity of 124 W/m. °K. Light metal LM20 has marginally greater a thermal conductivity of 155 Watts/m/°K. The small increase in thermal conductivity combined with the greater difficulty in casting, and the greater cost has previously prejudiced those skilled in the art against trying it. However, the inventors found that by using light metal specification LM20 a 3° K improvement in the temperature of critical components in the enclosure can be achieved. Therefore, there is a significant improvement in cooling by casting the enclosure in light metal LM20. For the enclosure illustrated, a 3° C. reduction in the temperature of the enclosure is obtained.

Referring to FIGS. 2 and 3, the deeper parts 8a of fins 8 are difficult to cast, being difficult or impossible to release from the mould. The problem is exacerbated by use of LM20. The problem occur with a two degree draft angle when the depth of the fins exceeded approximately 25 mm. The inventors found that easier release from the mould can be obtained by casting the fins with a two stage draft angle. Part 8a of the fin has a draft angle of 2° contained by plain opposed surfaces 14. These surfaces extend throughout the length of the fin. In part 8a, the fin has further opposed plain surfaces 16 between which there is a draft angle of 3°.

Figure 4:
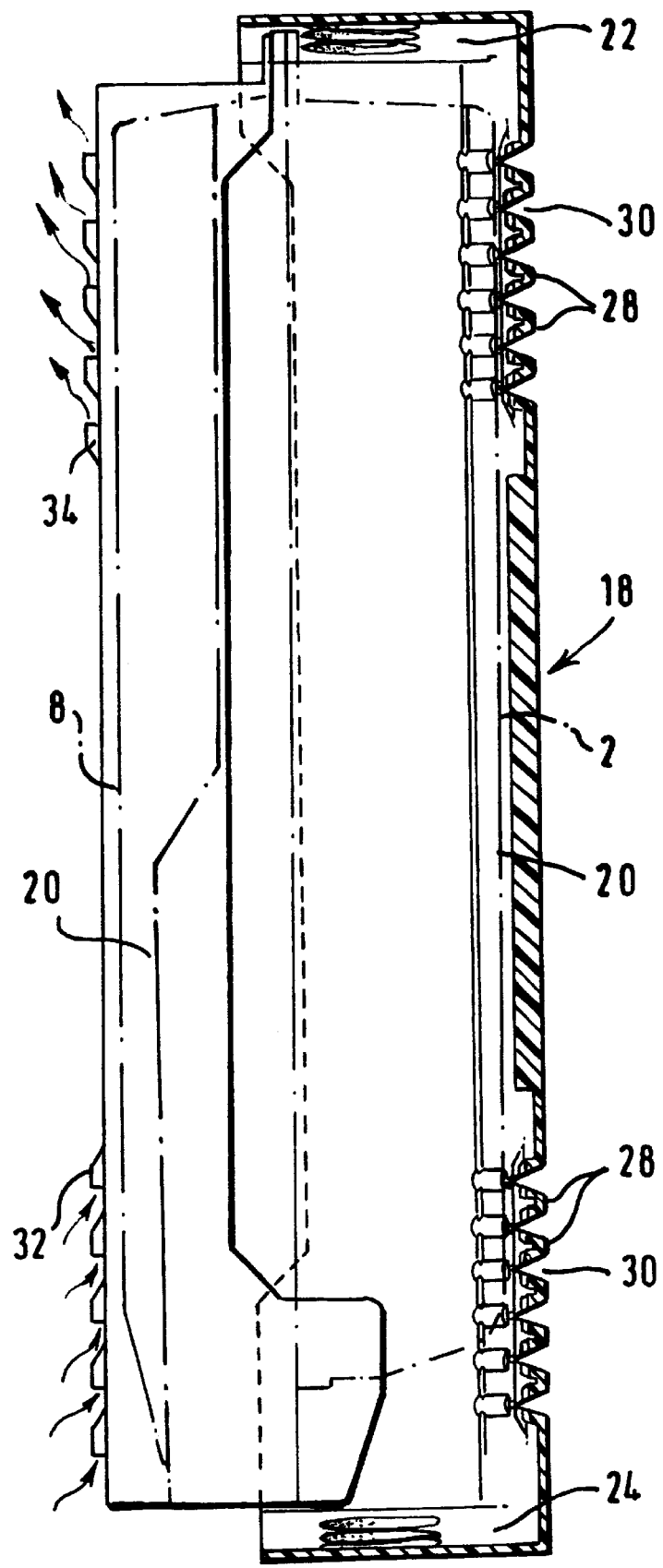
FIG. 4 is a side view, partly in cross section of the enclosure in an outer casing.
Figure 5:
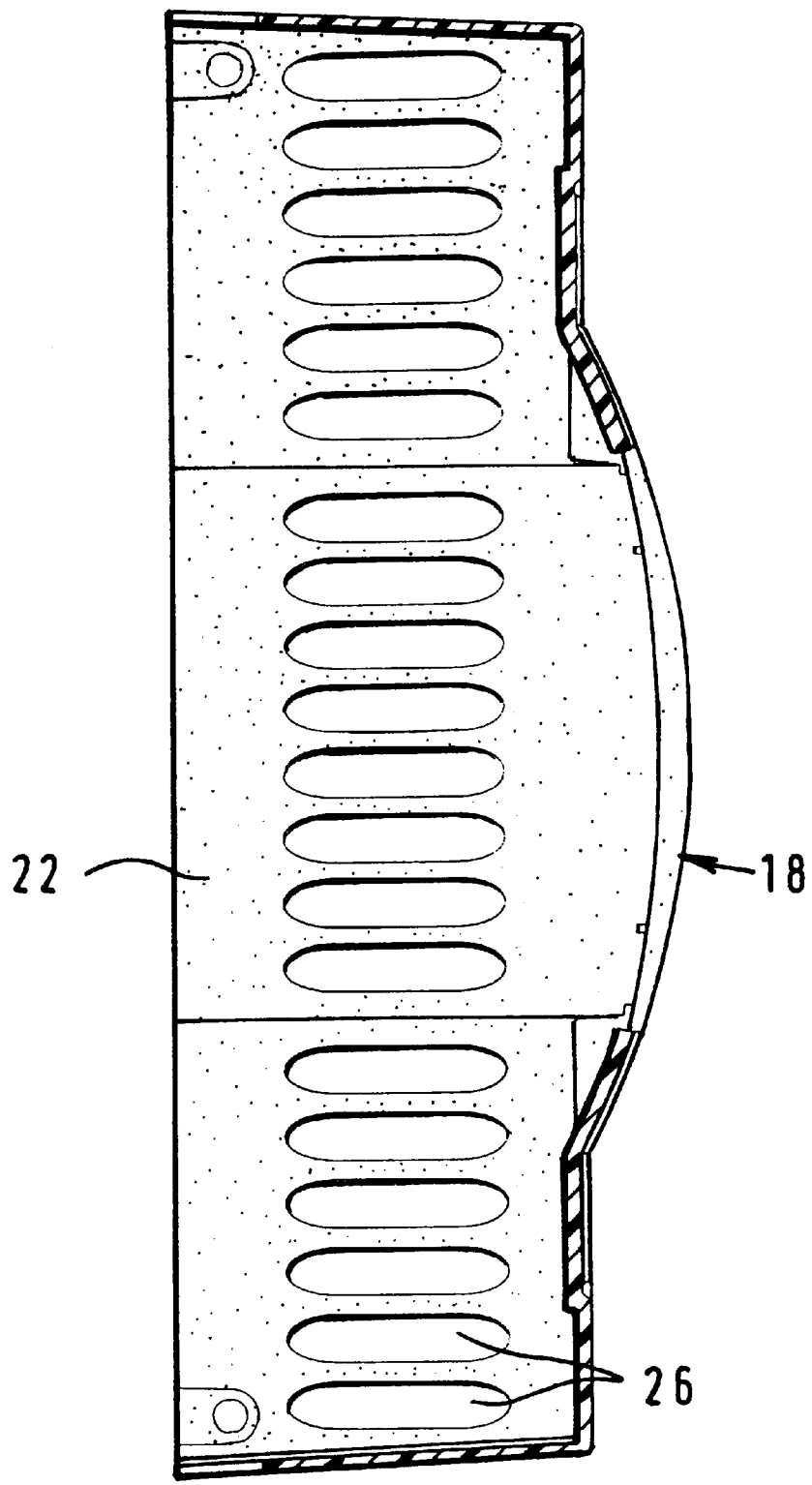
FIG. 5 is a top view of the casing of FIG. 4.
Figure 6:
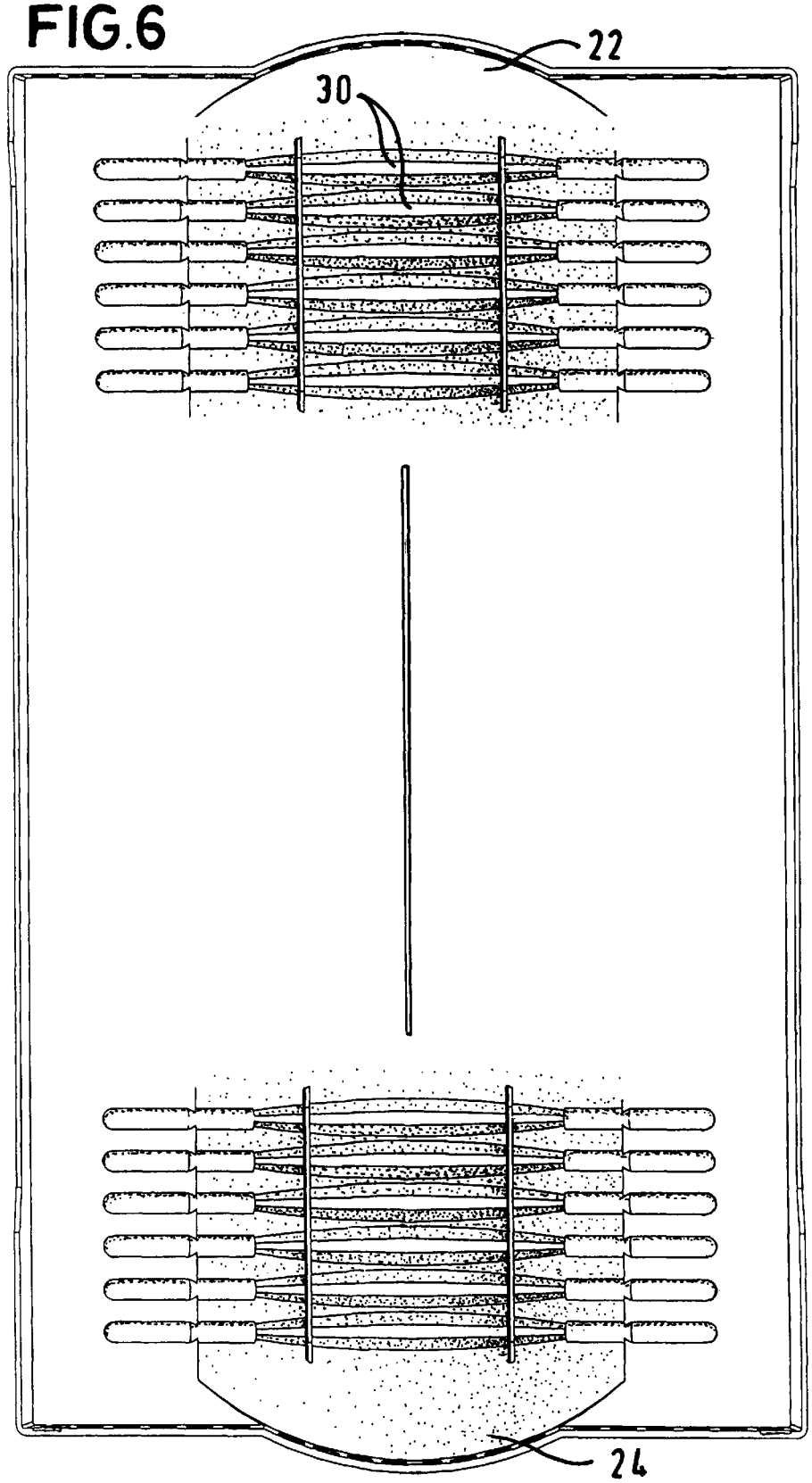
FIG. 6 is a front view of the casing.

Further improvements to cooling the enclosure are obtained by the provision of an outer case 18 shown in FIGS. 4, 5 and 6. The case 18 defines with the wall 7 of the enclosure air passages 20 into which fins 8 project. The case is provided at its top 22 and bottom 24 with vents 26 (the top and bottom are similar). In addition, the front of the case 18 is provided with louvers 28 between which are vents 30. The back of the case is provided with louvers 32 at the bottom and louvers 34 at the top. The louvers 32 slant upwards and inwards to assist the passage of air into the case. The louvers 34 slant upwards and outwards to assist the passage of air out of the case.

In general, the top of the enclosure will tend to be hotter than the bottom. In order to reduce the tendency it would be desirable to locate those units that dissipate most heat towards the bottom of the enclosure and those units that dissipate less heat towards the top of the case. Other considerations sometimes make that difficult. In the present case, the power amplifier, which dissipates large amounts of heat, is located above the duplexer, which dissipates comparatively little heat. In order reduce temperature difference between the top and the bottom of the enclosure, a heat pipe 36 has its evaporator 38 arranged to conduct heat from the upper part of the wall 7 or directly from the power amplifier to the condenser 40 in thermal contact with the lower part of the wall 7 in the region of the duplexer 6.

We claim:

1. Electronic apparatus having a heat dissipative external enclosure, the external enclosure comprising:

a plurality of containment walls, from at least one of which depend fins having a length extending vertically defining channels therebetween;

a thickness of the external enclosure between external surfaces of opposed containment walls, the thickness varying between a relatively thin portion and a relatively thick portion to provide an interior space having a relatively narrow portion and a relatively wide portion to accommodate components or units of corresponding different extent;

the fins having outer edges, spaced from one of the containment wall, and having plain first opposed surfaces adjacent their outer edges, said first surfaces including a first angle therebetween, and the fins or parts of the fins adjacent the relatively thin portion of the enclosure also having plain second opposed surfaces, said second surfaces including therebetween a second angle greater than the first angle.

2. Electronic apparatus as claimed in claim 1, wherein the relatively thick portion of the enclosure and the relatively thin portion of the enclosure are located one above another and wherein the first opposed surfaces extend the full length of the fins which extend over both portions.

3. Electronic apparatus as claimed in claim 1, wherein the first angle is approximately 2° and the second angle is approximately 3°.

4. Electronic apparatus as claimed in claim 3, wherein the depth to which the first angle extends is less than approximately 25 mm.

5. Electronic apparatus as claimed in claim 1, wherein the fins are evenly spaced and the outer edges lie in a common plane.

6. Electronic apparatus as claimed in claim 1, wherein the external enclosure is contained by a case that has side walls that with the containment walls define air passages into which the fins extend.

7. Electronic apparatus as claimed in claim 6, wherein the case has:

vents at the top and the bottom of the air passages;

louvers in one or more of its side walls;

louvers lower in the one or more of its side walls slanting upwards and inwards; and louvers higher in the one or more of its side walls slanting upwards and outwards.

8. Electronic apparatus as claimed in claim 1, wherein components or units dissipating higher power are located below components or units dissipating lower power.

9. Electronic apparatus as claimed in claim 7, further comprising a power supply unit located low in the external enclosure.

10. Electronic apparatus as claimed in claim 1, wherein the fins are spaced sufficiently that at no location is a boundary layer established completely across a channel by air flowing therein by convection.

11. Electronic apparatus as claimed in claim 1 comprising a transmitter/receiver for a cellular mobile telecommunications network.

12. Electronic apparatus as claimed in claim 1, wherein components or units dissipating higher power are coupled to the containment wall by a heat pipe having its condenser lower than the component or unit.

* * * * *